(12) United States Patent
Sakamoto (10) Patent No.: US 10,043,680 B2
(45) Date of Patent: Aug. 7, 2018

(54) METHOD FOR MANUFACTURING SEMICONDUCTOR DEVICE

(71) Applicant: Mitsubishi Electric Corporation, Tokyo (JP)

(72) Inventor: Ken Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 177 days.

(21) Appl. No.: 15/113,472

(22) PCT Filed: May 14, 2014

(86) PCT No.: PCT/JP2014/062829
§ 371 (c)(1),
(2) Date: Jul. 22, 2016

(87) PCT Pub. No.: WO2015/173906
PCT Pub. Date: Nov. 19, 2015

(65) Prior Publication Data
US 2017/0004981 A1    Jan. 5, 2017

(51) Int. Cl.
*H01L 21/78* (2006.01)
*H01L 21/56* (2006.01)
(Continued)

(52) U.S. Cl.
CPC ........ *H01L 21/565* (2013.01); *H01L 21/4825* (2013.01); *H01L 21/78* (2013.01);
(Continued)

(58) Field of Classification Search
None
See application file for complete search history.

(56) References Cited

U.S. PATENT DOCUMENTS 5,733,802 A    3/1998    Inoue et al.
6,081,978 A *  7/2000    Utsumi ............... H01L 21/565
                                              249/102
(Continued)

FOREIGN PATENT DOCUMENTS

JP    62-150755 A    7/1987
JP    H04-034958 A   2/1992
(Continued)

OTHER PUBLICATIONS

International Search Report issued in PCT/JP2014/062829, dated Sep. 2, 2014.
(Continued)

*Primary Examiner* — Michael Lebentritt
(74) *Attorney, Agent, or Firm* — Studebaker & Brackett PC (57) ABSTRACT

It is an object to provide a method for manufacturing a semiconductor device which can reduce degradation in package strength and a manufacturing cost, and promote miniaturization of a package. A method for manufacturing a semiconductor device includes steps of (a) preparing a lead frame having a die pad on which a semiconductor element is mounted, (b) placing a first resin which is granular in a mold, (c) placing the lead frame in the mold in such a manner that the first resin comes into contact with a lower side of the die pad, (d) filling the mold with a second resin on an upper side of the first resin in the mold, and (e) curing the first resin and the second resin, to mold the first resin and the second resin.

9 Claims, 7 Drawing Sheets

(51) Int. Cl.
  *H01L 21/48*  (2006.01)
  *H01L 23/31*  (2006.01)
  *H01L 23/495*  (2006.01)
  *H01L 23/373*  (2006.01)

(52) U.S. Cl.
  CPC ...... *H01L 23/3114* (2013.01); *H01L 23/3735* (2013.01); *H01L 23/3737* (2013.01); *H01L 23/4952* (2013.01); *H01L 23/49513* (2013.01); *H01L 23/49551* (2013.01); *H01L 23/49562* (2013.01); *H01L 23/49568* (2013.01); *H01L 23/49575* (2013.01); H01L 23/3107 (2013.01); H01L 23/3121 (2013.01); H01L 2224/32245 (2013.01); H01L 2224/48091 (2013.01); H01L 2224/48137 (2013.01); H01L 2224/48247 (2013.01); H01L 2224/73265 (2013.01); H01L 2924/181 (2013.01); H01L 2924/1815 (2013.01)

(56) References Cited

U.S. PATENT DOCUMENTS

| | | | |
|---|---|---|---|
| 7,372,137 | B2 | 5/2008 | Saeki |
| 8,624,408 | B2 | 1/2014 | Mino et al. |
| 2010/0006998 | A1 | 1/2010 | Masuda et al. |
| 2011/0241188 | A1* | 10/2011 | Mizuno ............... C08G 59/08 257/666 |
| 2013/0113121 | A1 | 5/2013 | Okada et al. |
| 2014/0284783 | A1 | 9/2014 | Sayama |
| 2015/0189703 | A1* | 7/2015 | Akazawa ............. H01L 33/508 313/503 |
| 2016/0218077 | A1* | 7/2016 | Azuma .................... B32B 7/12 |
| 2017/0236772 | A1* | 8/2017 | Yamagami .......... H01L 21/4825 257/676 |
| 2017/0330809 | A1* | 11/2017 | Kajihara ............... H01L 23/051 |

FOREIGN PATENT DOCUMENTS

| | | | |
|---|---|---|---|
| JP | 05-198707 | A | 8/1993 |
| JP | 08-037270 | A | 2/1996 |
| JP | H08-111465 | A | 4/1996 |
| JP | 2001-196532 | A | 7/2001 |
| JP | 2003-115505 | A | 4/2003 |
| JP | 2010-162710 | A | 7/2010 |
| JP | 4553813 | B2 | 9/2010 |
| JP | 2011-082389 | A | 4/2011 |
| JP | 2012-028510 | A | 2/2012 |
| JP | 2012-233083 | A | 11/2012 |
| JP | 2014-036046 | A | 2/2014 |
| JP | 2014-187209 | A | 10/2014 |
| KR | 10-2009-0076973 | A | 7/2009 |
| KR | 10-2013-0109951 | A | 10/2013 |
| KR | 10-2014-0009296 | A | 1/2014 |

OTHER PUBLICATIONS

Office Action issued by the Japanese Patent Office dated May 30, 2017 in corresponding Japanese Application No. 2016-519032.
An Office Action issued by the Korean Patent Office dated Sep. 6, 2017, which corresponds to Korean Patent Application No. 10-2016-7031148 and is related to U.S. Appl. No. 15/113,472.
An Office Action issued by the Korean Patent Office dated Feb. 6, 2018, which corresponds to Korean Patent Application No. 10-2016-7031148 and is related to U.S. Appl. No. 15/113,472.
Office Action issued by the Japanese Patent Office dated Feb. 7, 2017 in corresponding Japanese Application No. 2016-519032; 11pp.

* cited by examiner

METHOD FOR MANUFACTURING SEMICONDUCTOR DEVICE

TECHNICAL FIELD

The present invention relates to a method for manufacturing a semiconductor device, and more particularly to a method for manufacturing a semiconductor device for electric power and the like, which includes a highly heat-dissipating material having a greater thermal conductivity than a sealing resin, regarding heat generated in a power chip, a heat spreader, and a semiconductor element (Si/SiC and the like).

BACKGROUND ART

In a semiconductor device for electric power and the like, it is very important to efficiently dissipate heat generated in a power chip to an outside while ensuring a high insulation property. In order to enhance a heat dissipation capability, while it is preferable to reduce a thickness of an insulating layer on a lower side of a power chip, concerns are caused that reduction in a thickness of an insulating layer may degrade an insulation property.

Also, in a structure, a whole of which is full-molded with one kind of resin, a resin has more difficulties in running around an insulating-layer forming area as a thickness of an insulating layer is reduced, resulting in extremely degraded moldability, so that it is exceedingly difficult to reduce a thickness of an insulating layer. Therefore, there is no choice but to thicken an insulating layer to a certain degree, which causes degradation of heat dissipation property. In order to enhance a heat dissipation property while thickening an insulating layer to a certain degree, a resin having excellent thermal conductivity is used for an insulating layer. However, a resin having excellent thermal conductivity is expensive, and so, to use an expensive high-performance resin for an insulating layer including a part which does not need such a high-performance resin, would increase a manufacturing cost.

In view of the foregoing matters, for example, Patent Document 1 suggests a method in which both of ensured insulation and high heat dissipation can be easily achieved by using an insulating material which has a certain thickness and good thermal conductivity, for an insulating layer. This method, in which a high-performance insulating material is used only in a required part and immediately below a heat spreader, is advantageous also in terms of a manufacturing cost.

Like Patent Document 1, the following technique is developed in order to improve injectability of a resin into an area of an insulating layer immediately below a heat spreader. If injection of a resin immediately below a heat spreader is delayed, a weld is generated immediately below a heat spreader and a thickness of a resin is reduced due to a resin-injection pressure on an upper side of a heat spreader, resulting in occurrence of an insulation failure. By bending a lead frame vertically upward or providing a dam such as a notch in a front surface of a package, a function of a constriction part for regulating an injection amount of resin which is going to flow upward is provided, so that an amount of resin which flows into an insulating-layer forming area immediately below a heat spreader from a lower part of a lead frame is increased, to prevent generation of a weld immediately below a heat spreader.

PRIOR ART DOCUMENT

Patent Document

Patent Document 1: Japanese Patent Application Laid-Open No. 2003-115505

SUMMARY OF INVENTION

Problems to be Solved by the Invention

Nonetheless, a measure to control flowability of a resin as described in Patent Document 1 suffers from a problem of an increased cost for processing a lead frame. Also, it is necessary to seal a wire loop with a resin having a specified thickness, to cause a problem of difficulty in reducing a thickness of a package. Moreover, because of provision of a dam such as a notch in a front surface of a package, there is arisen a problem of degradation in package strength, which may possibly cause a crack.

Thus, it is an object of the present invention to provide a method for manufacturing a semiconductor device which can reduce degradation in package strength and a manufacturing cost, and promote miniaturization of a package.

Means for Solving the Problems

A method for manufacturing a semiconductor device according to the present invention includes the steps of: (a) preparing a lead frame having a die pad on which a semiconductor element is mounted; (b) placing a first resin which is granular in a mold;

(c) placing the lead frame in the mold in such a manner that the first resin comes into contact with a lower side of the die pad; (d) filling the mold with a second resin on an upper side of the first resin; and (e) curing the first resin and the second resin, to mold the first resin and the second resin.

Effects of the Invention

In accordance with the method for manufacturing a semiconductor device according to the present invention, in advance of molding, the first resin which is granular is placed, and the semiconductor element and the lead frame which are connected by a wire are placed in the mold in such a manner that the first resin comes into contact with a lower side of the die pad. Thereafter, the mold is filled with the second resin on an upper side of the first resin and the first resin and the second resin are cured to be molded.

Therefore, it is possible to prevent generation of a weld immediately below a heat spreader joined to a lower surface of a die pad, so that an insulating failure in a semiconductor device can be avoided. Also, since it is unnecessary to provide a dam such as a notch in a front surface of a package, degradation in package strength can be reduced. Further, since it is unnecessary to provide a dam such as a notch in a front surface of a package and a wire is sealed with a resin having a specified thickness, there is no need to increase a thickness of a package. As a result of this, it is possible to promote miniaturization of a package and reduce a manufacturing cost of a semiconductor device.

Objects, features, aspects, and advantages of the present invention will be made clearer from the following detailed description and accompanying drawings.

DESCRIPTION OF EMBODIMENTS

<Underlying Technology>

Figure 9:
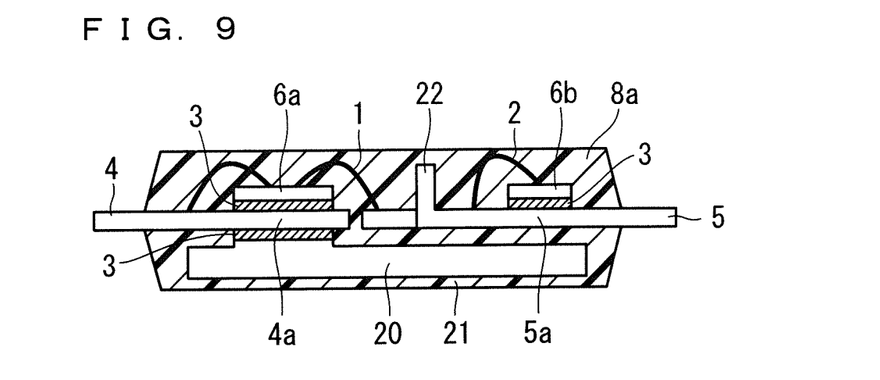
FIG. 9 is a sectional view of a semiconductor device according to an underlying technology.
Figure 10:
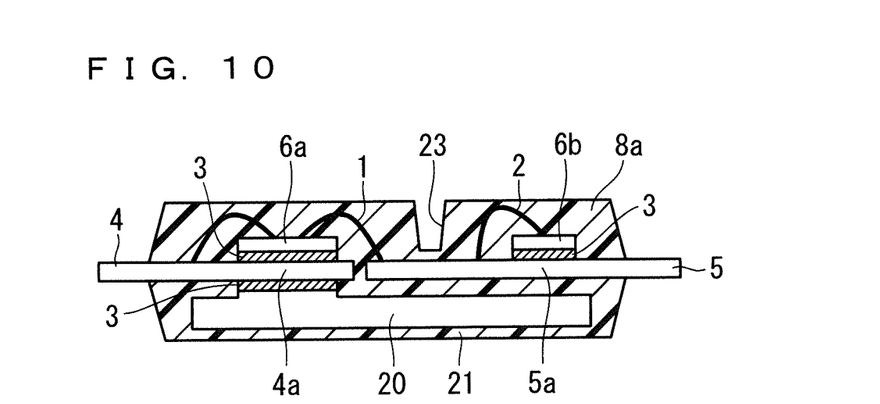
FIG. 10 is a sectional view of another semiconductor device according to the underlying technology.

Before describing a first preferred embodiment of the present invention, a structure of a semiconductor device according to an underlying technology will be described with reference to FIG. 9 and FIG. 10. FIG. 9 is a sectional view of a semiconductor device according to the underlying technology, and FIG. 10 is a sectional view of another semiconductor device according to the underlying technology.

As shown in FIG. 9, the semiconductor device according to the underlying technology includes semiconductor elements 6a and 6b, lead frames 4 and 5, wires 1 and 2, a heat spreader 20, and a molded resin 8a.

The semiconductor element 6a is a power chip, and more specifically, the semiconductor element 6a is an Si chip or an SiC chip. A back surface of the semiconductor element 6a is joined to a front surface of a die pad 4a of the lead frame 4 via solder 3. One end of the wire 1 is bonded to a plurality of electrodes (not shown in the drawings) which are formed on a front surface of the semiconductor element 6a, and the other end of the wire 1 is bonded to an inner lead part of the lead frame 4. The heat spreader 20 is electrically joined to the semiconductor element 6a by being joined to a back surface of the die pad 4a via the solder 3, to thereby dissipate heat of the semiconductor element 6a.

The semiconductor element 6b is a chip for driving the semiconductor element 6a which is a power chip. A back surface of the semiconductor element 6b is joined to a front surface of a die pad 5a of the lead frame 5 via the solder 3. One end of the wire 2 is bonded to a plurality of electrodes (not shown in the drawings) which are formed on a front surface of the semiconductor element 6b, and the other end of the wire 2 is bonded to an inner lead part of the lead frame 5. The inner lead part of the lead frame 5 is bent upward, to form a processed-frame part 22. The molded resin 8a seals the semiconductor elements 6a and 6b, the inner lead parts of the lead frames 4 and 5, the wires 1 and 2, and the heat spreader 20.

As shown in FIG. 10, another semiconductor device according to the underlying technology, similarly to the case in FIG. 9, includes the semiconductor element 6a, the lead frames 4 and 5, the wires 1 and 2, the heat spreader 20, and the molded resin 8a. A difference from the case in FIG. 9 lies in that, in place of the processed-frame part 22, a trench 23 is provided in an area of the molded resin 8a (package) located between the wires 1 and 2.

In the course of manufacture of a semiconductor device, each of the processed-frame part 22 and the trench 23 functions as a constriction part for regulating an injection amount of resin which is going to flow upward, and increases an amount of resin which flows from a lower part of the lead frames 4 and 5 into an insulating layer 21 formed immediately below the heat spreader 20, to thereby prevent generation of a weld immediately below the heat spreader 20.

In a method for manufacturing a semiconductor device according to a first preferred embodiment of the present invention, generation of a weld immediately below the heat spreader 20 is prevented without providing the processed-frame part 22 or the trench 23.

<First Preferred Embodiment>

Figure 1:
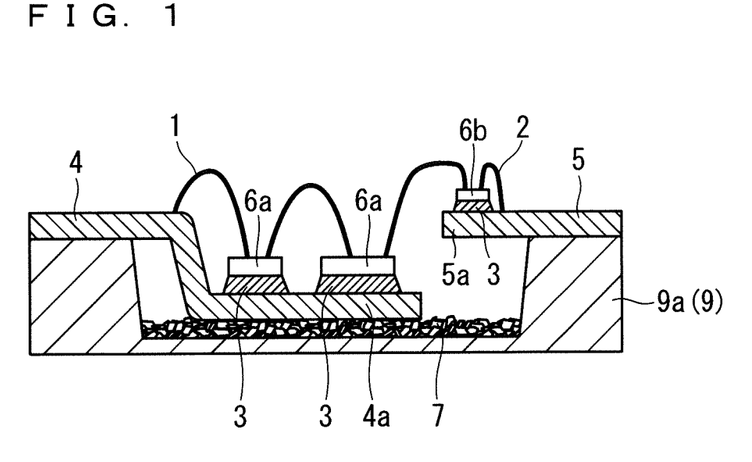
FIG. 1 is a sectional view showing a state where a lead frame is placed in a mold in a method for manufacturing a semiconductor device according to a first preferred embodiment.
Figure 2A:
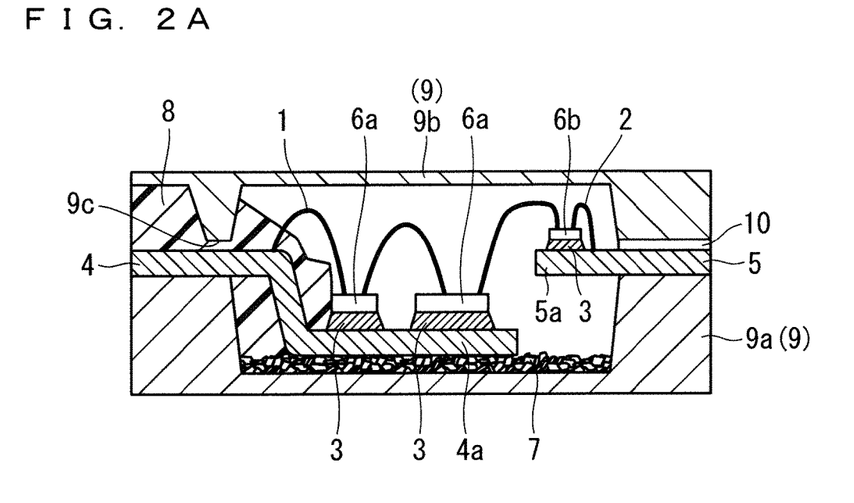
FIGS. 2A and 2B are sectional views showing a state where a second resin is injected into a mold in the method for manufacturing a semiconductor device according to the first preferred embodiment.
Figure 2B:
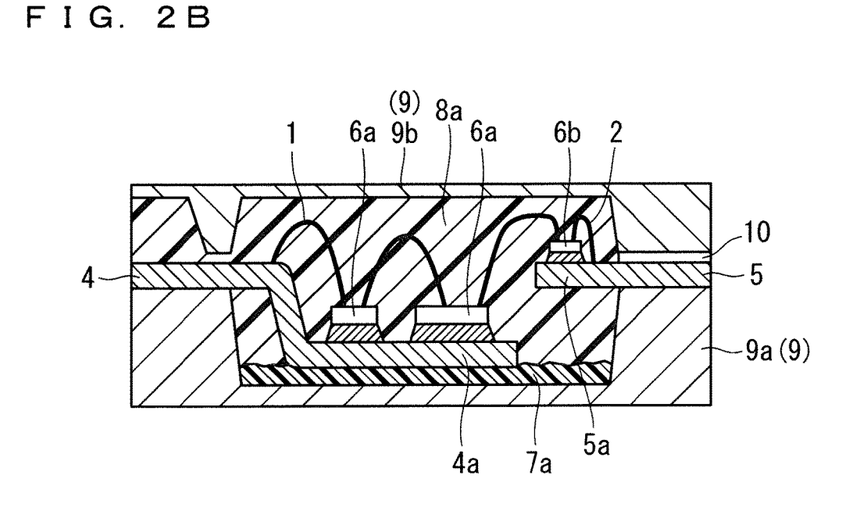

Next, the first preferred embodiment of the present invention will be described as follows, with reference to the accompanying drawings. FIG. 1 is a sectional view showing a state where the lead frames 4 and 5 are placed in a mold 9 in the method for manufacturing a semiconductor device according to the first preferred embodiment, FIG. 2A is a sectional view showing a state where a resin 8 is injected into the mold 9 in the method for manufacturing a semiconductor device, and FIG. 2B shows states of resins 7 and 8 after being cured. It is noted that in the first preferred embodiment, the same elements as described in the underlying technology will be denoted by the same reference signs, and description thereof will be omitted.

As shown in FIG. 1, a granular resin 7 (first resin) is placed in a lower mold 9a so as to have a uniform thickness. Each of individual grains of the resin 7 is formed into a predetermined size. It is noted that the granular resin 7 includes a powdery resin provided before being tableted and a fragmentary resin. Further, not only a granular resin but also a plate-like (box-like) or liquid resin which can fill a clearance between a lower end of the die pad 4a and a bottom surface of the mold 9 may be used.

Although a void is likely to be generated in the granular resin 7 before molding, generation of a void after molding can be suppressed by having a time of evacuation in the mold 9. As shown in FIG. 2A, the mold 9 includes the lower mold 9a, an upper mold 9b, and a side gate 9c. The side gate 9c is an inlet for injecting a liquid resin 8 (second resin) sideways relative to the semiconductor elements 6a and 6b.

The resin 8 is injected from the side gate 9c (transfer molding), and the resin 7 and the resin 8 are molded with the resin 7 being compressed by the resin 8. In this regard, the resin 7 and the resin 8 are resins of the same kind though they are different in that the resin 7 is granular and the resin 8 is liquid. In a case where the resin 7 and the resin 8 are resins of the same kind, it is preferable to use a resin of a kind which can easily achieve stable adhesion at an interface between the resin 7 and the resin 8, and has a high heat dissipation property, for the resin 7 and the resin 8. The resin 7 and the resin 8 are heated, and thereafter, are melted. However, since the properties are similar and times at which the resin 7 and the resin 8 respectively have the lowest melt viscosities are almost the same during compression in transfer molding, the resin 7 and the resin 8 are strongly adhered (chemically bonded) at an interface thereof after molding, which eliminates a possibility of occurrence of interfacial delamination or a failure of a crack in a resin.

Next, a method for manufacturing a semiconductor device will be described. As shown in FIG. 1, the lead frame 4 having the die pad 4*a* on which the semiconductor element 6*a* is mounted is prepared (step (a)). More specifically, two semiconductor elements 6*a* are placed on the die pad 4*a* of the lead frame 4, and an upper surface of the die pad 4*a* and the two semiconductor elements 6*a* are joined by the solder 3. The semiconductor element 6*b* is placed on the die pad 5*a* of the lead frame 5, and an upper surface of the die pad 5*a* and the semiconductor element 6*b* are joined by the solder 3. It is noted that the number of the semiconductor elements 6*a* mounted on the lead frame 4 is not limited to two.

The lead frame 4 and the semiconductor elements 6*a* are connected by wires, and also, the lead frame 5 and the semiconductor element 6*b* are connected by wires. More specifically, the two semiconductor elements 6*a*, as well as the semiconductor element 6*a* on a left-hand side in FIG. 1 and the lead frame 4, are connected to each other by a wire 1 (wiring). Also, the semiconductor element 6*a* on a right-hand side in FIG. 1 and the semiconductor element 6*b*, as well as the semiconductor element 6*b* and the lead frame 5, are connected to each other by a wire 2. Further, a heat spreader (not shown in the drawings) is joined to a lower surface of the die pad 4*a* of the lead frame 4 by solder. That is, in the step (a), a mounting frame which is an object being molded and has been subjected to processes up to a wire-bonding step, is manufactured.

The above-described inner structure is collectively sealed with a molded resin, so that functions of protection from an outside air, insulation, and heat dissipation are performed. In particular, a molded resin located on a lower side of the die pad 4*a* or the heat spreader is an important part which performs functions of insulation and heat dissipation. In order to perform those functions, it is important to have a thickness so designed as to prevent generation of a void in the molded resin located on a lower side of the die pad 4*a* or the heat spreader after molding.

Next, the resin 7 is placed so as to have a predetermined first height (design value) in the mold 9 (step (b)). The lead frames 4 and 5 prepared in the step (a) are placed in the mold 9 in such a manner that the resin 7 comes into contact with a lower side of the die pad 4*a* (step (c)). In this regard, a lower side of the die pad 4*a* is a lower end of the heat spreader in a case where the heat spreader is joined to a lower surface of the die pad 4*a*, and a lower side of the die pad 4*a* is a lower end of the die pad 4*a* in a case where the heat spreader is not joined to a lower surface of the die pad 4*a*. In other words, in the step (c), the mounting frame which has been subjected to processes up to a wire-bonding step, is set at a predetermined position in the mold 9.

The lead frame 4 is bent in such a manner that the outer lead part is located above an inner lead part, and the outer lead part is held between the lower mold 9*a* and the upper mold 9*b* (refer to FIG. 2A). Also, the lead frame 5 is formed into a straight line. In the lead frame 5, an outer lead part is held between the upper mold 9*b* and the lower mold 9*a*, and the inner lead part is located above the inner lead part of the lead frame 4, so that the resin 7 is not in contact with a lower end of the die pad 5*a* of the lead frame 5.

As shown in FIG. 2A, after clamping with the mold 9, the resin 8 is injected from the side gate 9*c* to an upper side of the resin 7 in the mold 9 to fill the mold 9 by a transfer molding method (step (d)). Since the resin 7 is previously placed on a lower side of the die pad 4*a*, a weld reaches a periphery of an air vent 10 located on an upper side of the lead frame 5. Next, as shown in FIG. 2B, the resin 7 and the resin 8 are cured to be molded (step (e)). At that time, the granular resin 7 and the liquid resin 8 are cured, to be changed into a molded resin 7*a* and the molded resin 8*a*, respectively.

Next, after a heating step for completely curing the resin 7 and the resin 8 is carried out, cutting of a redundant part of a frame such as a tie bar, molding of a lead terminal, a product test, and the like are carried out, so that a product is completed.

As described above, in the method for manufacturing a semiconductor device according to the first preferred embodiment, in advance of molding, the granular resin 7 is placed, and the semiconductor elements 6*a* and the lead frame 4 which are connected by the wire 1 are placed in the mold 9 in such a manner that the resin 7 comes into contact with a lower side of the die pad 4*a*. Thereafter, the mold 9 is filled with the resin 8 on an upper side of the resin 7 and the resin 7 and the resin 8 are cured to be molded. More specifically, the resin 8 is injected from the side gate 9*c* of the mold 9 to fill the mold 9, and the resin 7 and the resin 8 are molded with the resin 7 being compressed by the resin 8.

Therefore, it is possible to prevent generation of a weld immediately below the heat spreader, to thereby avoid an insulation failure in a semiconductor device. Further, there is no need to provide a dam such as a notch in a front surface of a package, so that degradation in package strength can be suppressed. Further, there is no need to provide a dam such as a notch in a front surface of a package and the wires 1 and 2 are sealed with the resin 8 having a specified thickness, which eliminates a need to increase a thickness of a package. As a result of this, it is possible to promote miniaturization of a package and reduce a manufacturing cost of a semiconductor device.

Moreover, even if a void is likely to be generated in the granular resin 7 before molding, generation of a void after molding can be suppressed by having a time of evacuation in the mold 9.

Next, comparison will be made between a semiconductor device manufactured by the method for manufacturing a semiconductor device according to the first preferred embodiment and a semiconductor device provided in a case where an insulating sheet is placed on a lower side of a die pad. In a semiconductor device provided in a case where an insulating sheet is placed on a lower side of a die pad, an insulating sheet has a high heat dissipation property (2 to 3 W/m·K) and a high insulation property, so that a material cost for a filler is expensive. Also, as an insulating sheet should be adhered to a metal material such as a die pad or a heat spreader at a time of molding, it is difficult to manufacture such an insulating sheet and a manufacturing cost is increased.

In contrast thereto, in a case of a collectively molded product in which a molded resin is present on a lower side of a die pad, such as a semiconductor device manufactured by the method for manufacturing a semiconductor device according to the first preferred embodiment, the following advantages are provided. In a package which includes a resin having a thickness of approximately 200 μm on a lower side of a die pad, and fulfills a heat dissipation function which is to be provided when thermal conductivity of a resin is 2 W/m·K, by choosing a highly heat-dissipating molded resin (2 W/m·K), it is possible to reduce a cost as compared to a case where an insulating sheet is placed. Further, the number of kinds of direct materials can be reduced, to thereby simplify a process (device), so that a cost can be reduced.

Further, in the mold 9, since the resin 7 which is powdery or fragmentary can be placed so as to have the first height, it is possible to choose an optimum resin from resins in various states which are satisfactory in terms of a material cost and properties (an insulation property or a heat dissipation property).

Moreover, in the mold 9, the resin 7 having a greater insulation property than the resin 8 can be placed so as to have the first height. As a resin having a high insulation property, an epoxy resin which has a high molecular weight and a low permittivity can be employed. In this case, by placing the resin 7 having a great insulation property locally on a lower side of the die pad 4a which requires insulation function, it is possible to produce further effects of enhancement in an insulation property and cost reduction.

Detailed description regarding the above matter will be provided. In a power module on which a semiconductor element is mounted, and more particularly, in a power module on which an SiC chip operating at a high temperature is mounted, further insulation should be carried out for a cooling fin via a die pad and a heat spreader which are provided on a lower side of a chip. While it is preferable that a resin on a lower side of a die pad and a heat spreader includes a highly insulating material, such a material is expensive. If such a resin is used for a whole of a sealing resin of a power module, a material cost is increased, and thus, to use a material having a high insulation property for a resin locally only on a lower side of a die pad could attain a power module which allows for a high insulation property and a reduced cost.

Also, in the mold 9, the resin 7 having a higher heat dissipation property than the resin 8 can be placed so as to have the first height. As a resin having a high heat dissipation property, a close-packed resin obtained by combining a resin having a large filler grain size with a resin having a fine filler grain size can be employed. In this case, by placing a highly heat-dissipating material locally on a lower side of the die pad 4a which requires heat dissipation, it is possible to produce further effects of reduction in thermal resistance and cost reduction.

Detailed description regarding the above matter will be provided. In a power module on which a semiconductor element is mounted, and more particularly, in a power module on which an SiC chip operating at a high temperature is mounted, further heat dissipation should be carried out for a cooling fin via a die pad or a heat spreader which is provided on a lower side of a chip. While it is preferable that a resin provided on a lower side of a die pad includes a highly heat-dissipating material, such a material is expensive. If such a resin is employed for a whole of a sealing resin of a power module, a material cost is increased, and thus, to use a highly heat-dissipating material for a resin locally only on a lower side of a die pad could attain a power module which allows for a high heat dissipation property and a reduced cost.

Figure 3:
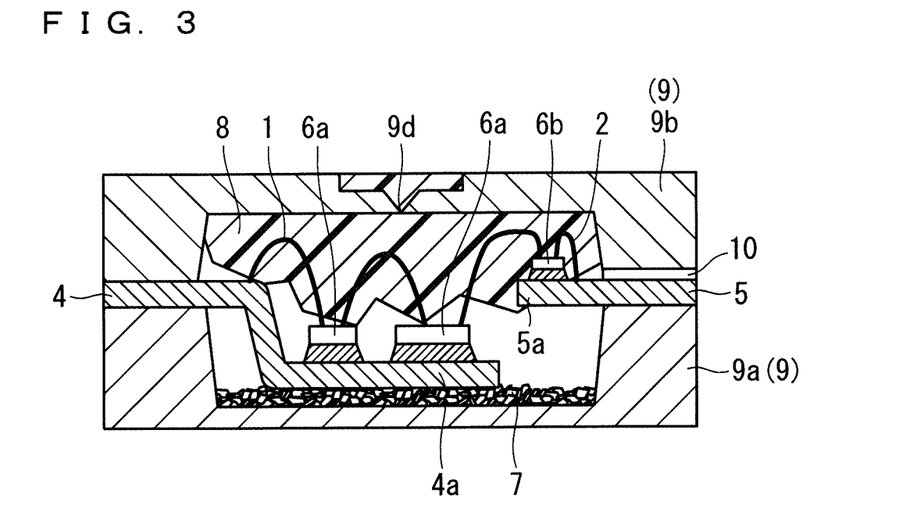
FIG. 3 is a sectional view showing a state where a second resin is injected into a mold in a method for manufacturing a semiconductor device according to a modification of the first preferred embodiment.

As shown in FIG. 3, a top-gate method can also be employed. FIG. 3 is a sectional view showing a state where the resin 8 is injected into the mold 9 in a method for manufacturing a semiconductor device according to a modification of the first preferred embodiment. The mold 9 includes a top gate 9d for injecting the resin 8 from above the semiconductor elements 6a and 6b, in place of the side gate 9c. The resin 8 is injected from the top gate 9d of the mold 9 to fill the mold 9, and the resin 7 and the resin 8 are molded with the resin 7 being uniformly compressed by the resin 8. By injecting the resin 8 from above the semiconductor elements 6a and 6b, a distance traveled of the resin 8 relative to the wires 1 and 2 is reduced as compared to a case where injection is carried out by a side-gate method, so that wire deformation can be suppressed.

<Second Preferred Embodiment>

Figure 4:
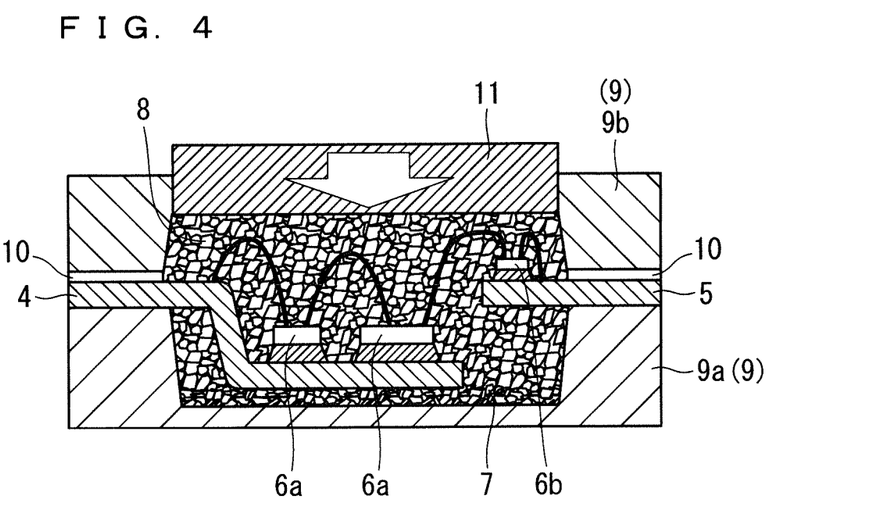
FIG. 4 is a sectional view showing a state where a second resin and a first resin are compressed by an upper-mold cavity in a method for manufacturing a semiconductor device according to a second preferred embodiment.

Next, a method for manufacturing a semiconductor device according to a second preferred embodiment will be described. FIG. 4 is a sectional view showing a state where the resin 8 and the resin 7 are compressed by an upper-mold cavity 11 in the method for manufacturing a semiconductor device according to the second preferred embodiment. It is noted that in the second preferred embodiment, the same elements as described in the first preferred embodiment will be denoted by the same reference signs, and description thereof will be omitted.

In the second preferred embodiment, the resin 8 is formed into grains. The mold 9 includes the lower mold 9a, the upper mold 9b, and the upper-mold cavity 11. The upper-mold cavity 11 is provided in the upper mold 9b, and is moved downward to the lower mold 9a, to thereby compress the resin 8 and the resin 7.

After the mounting frame is placed in the mold 9, the resin 8 formed into grains is sprayed within the mold 9 to fill the mold 9. After clamping with the mold 9, the upper-mold cavity 11 is moved downward to the lower mold 9a, to thereby mold the resin 8 and the resin 7 while compressing the resin 8 and the resin 7.

As described above, in the method for manufacturing a semiconductor device according to the second preferred embodiment, the mold 9 includes the lower mold 9a on which the lead frames 4 and 5 are placed, and the upper-mold cavity 11 which is moved downward to the lower mold 9a to compress the resin 8 and the resin 7. The resin 8 formed into grains is sprayed within the mold 9 to fill the mold 9, and the upper-mold cavity 11 is moved downward to the lower mold 9a, to thereby mold the resin 8 and the resin 7 while compressing the resin 8 and the resin 7. Therefore, by utilizing, not a transfer method, but movement of the upper-mold cavity 11, for compressing the resin 8, a distance traveled of a resin relative to the wires 1 and 2 is significantly reduced as compared to a case where a transfer method (a side gate and a top gate) is used, so that wire deformation can be suppressed.

<Third Preferred Embodiment>

Figure 5:
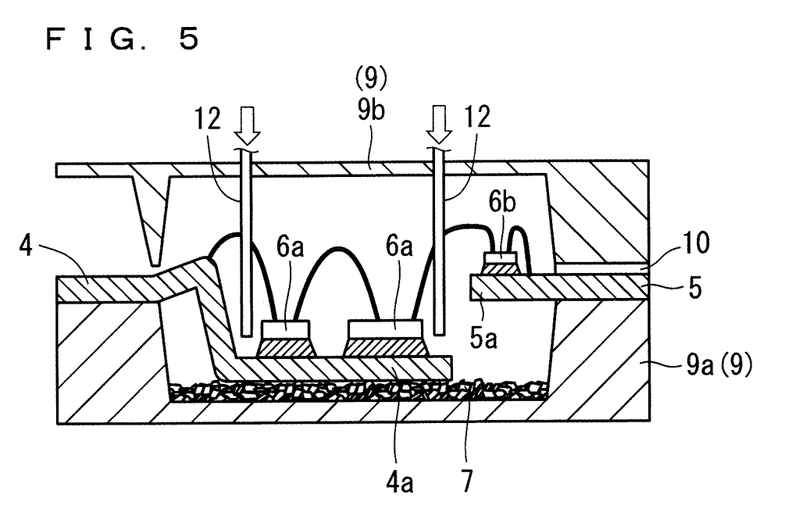
FIG. 5 is a sectional view showing a state where a lead frame is placed in a mold in a method for manufacturing a semiconductor device according to a third preferred embodiment.
Figure 6:
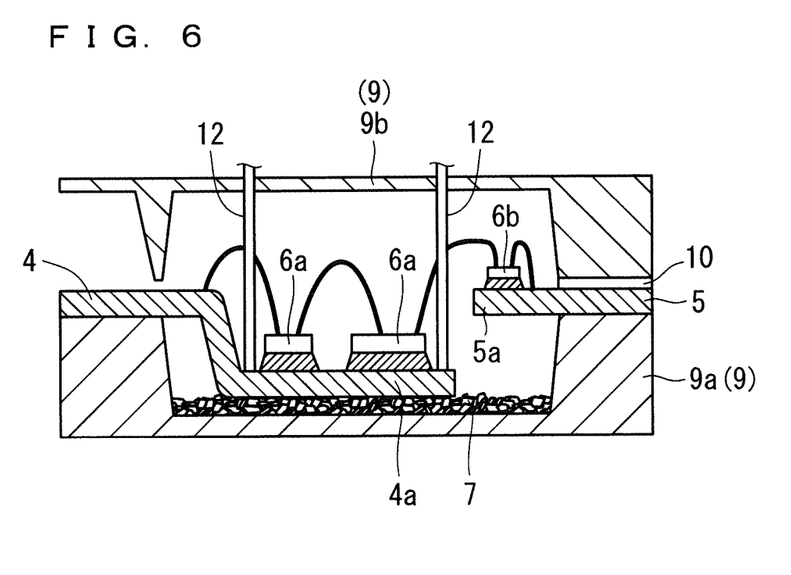
FIG. 6 is a sectional view showing a state where provisional compression is carried out with a movable pin in the method for manufacturing a semiconductor device according to the third preferred embodiment.
Figure 7:
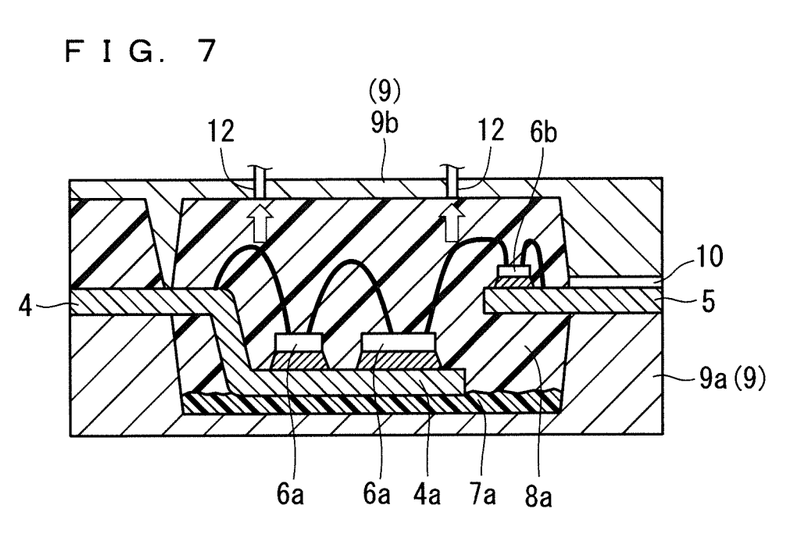
FIG. 7 is a sectional view showing a state where a movable pin is pulled out from a mold after a second resin is injected into the mold in the method for manufacturing a semiconductor device according to the third preferred embodiment.

Next, a method for manufacturing a semiconductor device according to a third preferred embodiment will be described. FIG. 5 is a sectional view showing a state where the lead frames 4 and 5 are placed in the mold 9 in the method for manufacturing a semiconductor device according to the third preferred embodiment, FIG. 6 is a sectional view showing a state where provisional compression is carried out with a movable pin 12 in the method for manufacturing a semiconductor device, and FIG. 7 is a sectional view showing a state where the movable pin 12 is pulled out from the mold 9 after the resin 8 is injected into the mold 9 in the method for manufacturing a semiconductor device. It is noted that in the third preferred embodiment, the same elements as described in the first and second preferred embodiments will be denoted by the same reference signs, and description thereof will be omitted.

In the third preferred embodiment, the movable pin 12 for holding down the die pad 4a is used for provisionally compressing the resin 7. As shown in FIG. 5, in the mold 9, for example, the resin 7 is placed so as to have a second height which is 1.5 times the first height. The lead frame 4 is placed in the mold 9 in such a manner that the resin 7 comes into contact with a lower end of the die pad 4a. Regarding this, the second height is a height, with which the resin 7 causes the die pad 4a to warp upward when the lead frame 4 is placed in the mold 9, and is not limited to 1.5 times the first height.

After clamping with the mold 9, as shown in FIG. 6, the die pad 4a is held down by the movable pin 12, to provisionally compress the resin 7 in such a manner that an upper surface of the resin 7 is at the first height (step (f)). By provisionally compressing the resin 7, a void in the resin 7 can be removed. Subsequently, as shown in FIG. 7, in the mold 9, after the resin 8 is injected to an upper side of the resin 7 to fill the mold 9, the movable pin 12 is pulled out from the mold 9 (step (g)). Thereafter, while the resin 7 and the resin 8 are cured to be molded, a shape of the movable pin 12 is not left in a semiconductor device provided after molding because the movable pin 12 is pulled out from the mold 9.

As described above, in the method for manufacturing a semiconductor device according to the third preferred embodiment, after the lead frame 4 is placed in the mold 9 in such a manner that the resin 7 comes into contact with a lower side of the die pad 4a, the die pad 4a is held down by the movable pin 12 for holding down the die pad 4a, to provisionally compress the resin 7. The mold 9 is filled with the resin 8 on an upper side of the resin 7 in the mold 9, and thereafter, the movable pin 12 is pulled out from the mold 9.

In molding the resin 7 immediately below the die pad 4a, only with a pressure of the resin 8 in transfer molding or the like, yield may possibly be unstable due to generation of a void (heat dissipation or insulation failure) or the like after molding. Thus, by employing the method according to the third preferred embodiment, after molding, a void in the resin 7 immediately below the die pad 4a can be minimized, and the resin 7 can have a thickness as designed, to thereby improve yield.

<Fourth Preferred Embodiment>

Figure 8A:
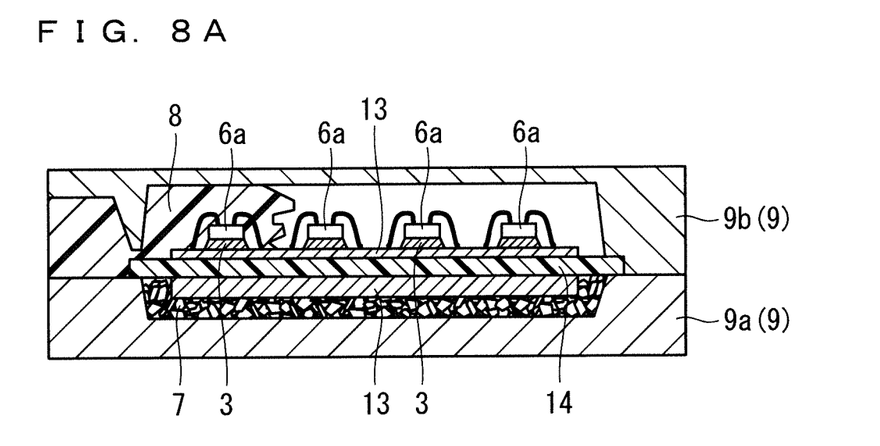
FIGS. 8A and 8B are sectional views showing a state where a second resin is injected into a mold in a method for manufacturing a semiconductor device according to a fourth preferred embodiment.
Figure 8B:
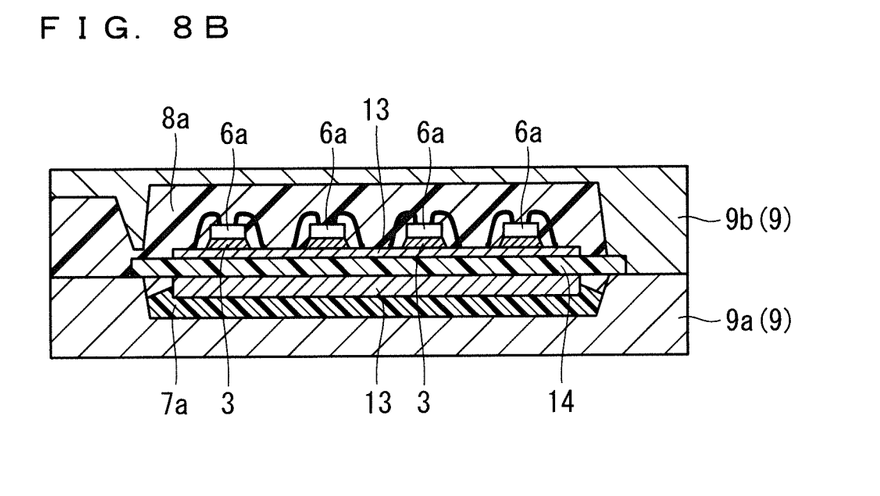

Next, a method for manufacturing a semiconductor device according to a fourth preferred embodiment will be described. FIG. 8A is a sectional view showing a state where the resin 8 is injected into the mold 9 in the method for manufacturing a semiconductor device according to the fourth preferred embodiment, and FIG. 8B is a view showing states of the resin 7 and the resin 8 after being cured. It is noted that in the fourth preferred embodiment, the same elements as described in the first to third preferred embodiments will be denoted by the same reference signs, and description thereof will be omitted.

The fourth preferred embodiment is an example of a method for manufacturing a semiconductor device of a mold array package (MAP)-molded type. In this regard, MAP molding means molding of an insulating substrate 14 as a whole, on which a plurality of semiconductor elements 6a are mounted, and after molding, the insulating substrate 14 is segmented into individual semiconductor devices. As shown in FIGS. 8A and 8B, the insulating substrate 14 on which the plurality of semiconductor elements 6a are mounted before segmentation is prepared. Here, description about the insulating substrate 14 will be provided. The insulating substrate 14 has an upper surface and a lower surface to which metal patterns 13 are fixed, and the plurality of semiconductor elements 6a are joined to an upper surface of an upper one of the metal patterns 13 by the solder 3.

Subsequently, in the mold 9, the resin 7 is placed so as to have the first height. The insulating substrate 14 is placed in the mold 9 in such a manner that the resin 7 comes into contact with a lower side of the insulating substrate 14. More specifically, an end part extending in a width direction of the insulating substrate 14 is held between the upper mold 9b and the lower mold 9a, and the resin 7 is in contact with a lower end of the metal pattern 13 which is fixed to a lower surface of the insulating substrate 14.

Subsequently, in the mold 9, the resin 8 is injected to an upper side of the resin 7 via an upper surface of the insulating substrate 14 to fill the mold 9, and the resin 7 and the resin 8 are molded with the resin 7 being compressed by the resin 8.

As described above, in the method for manufacturing a semiconductor device according to the fourth preferred embodiment, after the insulating substrate 14 on which the plurality of semiconductor elements 6a are mounted before segmentation is prepared and the resin 7 is placed in the mold 9, the insulating substrate 14 is placed in the mold 9 in such a manner that the resin 7 comes into contact with a lower side of the insulating substrate 14.

In a case of a semiconductor device of a MAP-molded type which is segmented using a rotary blade or the like after molding, it is general that only an inner material on an upper side of an insulating substrate is sealed. This is because granular resins cannot be sufficiently packed only by compression molding and a void can be easily generated due to unstable injection of a molded resin into an area immediately below an insulating substrate. In accordance with the method for manufacturing a semiconductor device according to the fourth preferred embodiment, also a lower side of the insulating substrate 14 can be sealed by a molded resin without allowing generation of a void due to a weld.

While the present invention has been described in detail, the above description is only illustrative in all aspects and the present invention is not limited to the above description. It should be interpreted that numerous modifications not illustrated can be devised without departing from the scope of the present invention.

Additionally, in the present invention, the respective preferred embodiments can be arbitrarily combined and each of the preferred embodiments can be appropriately altered and omitted within the scope of the present invention.

REFERENCE SIGNS LIST

4: lead frame, 4a: die pad, 6a: semiconductor element, 7: resin (first resin), 8: resin (second resin), 9: mold, 9a: lower mold, 9c: side gate, 9d: top gate, 11: upper-mold cavity, 12: movable pin, 14: insulating substrate.

The invention claimed is:

1. A method for manufacturing a semiconductor device, comprising the steps of:

(a) preparing a lead frame having a die pad on which a semiconductor element is mounted;
(b) placing a first resin which is granular in a mold;
(c) placing said lead frame in said mold in such a manner that said first resin comes into contact with a lower side of said die pad;
(d) filling said mold with a second resin on an upper side of said first resin in said mold; and
(e) curing said first resin and said second resin, to mold said first resin and said second resin.

2. The method for manufacturing a semiconductor device according to claim 1, wherein
said step (b) includes a step of placing said first resin which is powdery or fragmentary in the mold.

3. The method for manufacturing a semiconductor device according to claim 1, wherein
said mold includes a side gate for injecting said second resin sideways relative to said semiconductor element,
said step (d) includes a step of injecting said second resin from said side gate of said mold to fill said mold, and
said step (e) includes a step of molding said first resin and said second resin with said first resin being compressed by said second resin.

4. The method for manufacturing a semiconductor device according to claim 1, wherein
said mold includes a top gate for injecting said second resin from above said semiconductor element,
said step (d) includes a step of injecting said second resin from said top gate of said mold to fill said mold, and
said step (e) includes a step of molding said first resin and said second resin with said first resin being compressed by said second resin.

5. The method for manufacturing a semiconductor device according to claim 1, wherein
said mold includes a lower mold on which said lead frame is placed, and an upper-mold cavity which is moved downward to said lower mold to compress said second resin and said first resin,
said step (d) includes a step of spraying said second resin which is formed into grains within said mold to fill said mold, and
said step (e) includes a step of molding said second resin and said first resin while compressing said second resin and said first resin by moving said upper-mold cavity downward to said lower mold.

6. The method for manufacturing a semiconductor device according to claim 1, wherein
said step (b) includes a step of placing said first resin which has a greater insulation property than said second resin in said mold.

7. The method for manufacturing a semiconductor device according to claim 1, wherein
said step (b) includes a step of placing said first resin which has a greater heat dissipation property than said second resin in said mold.

8. The method for manufacturing a semiconductor device according to claim 1, further comprising the steps of:
(f) provisionally compressing said first resin by holding down said die pad with a movable pin for holding down said die pad, after said step (c); and
(g) pulling out said movable pin from said mold after said step (d).

9. The method for manufacturing a semiconductor device according to claim 1, wherein
said step (a) includes a step of preparing an insulating substrate on which a plurality of semiconductor elements are mounted before segmentation, in place of said lead frame, and
said step (c) includes a step of placing said insulating substrate in said mold in such a manner that said first resin comes into contact with a lower side of said insulating substrate.

* * * * *